United States Patent
Parthasarathi et al.

[11] Patent Number: 5,969,414
[45] Date of Patent: Oct. 19, 1999

[54] SEMICONDUCTOR PACKAGE WITH MOLDED PLASTIC BODY

[75] Inventors: Arvind Parthasarathi, North Branford; Deepak Mahulikar, Madison, both of Conn.

[73] Assignee: Advanced Technology Interconnect Incorporated, Manteca, Calif.

[21] Appl. No.: 08/249,104

[22] Filed: May 25, 1994

[51] Int. Cl.[6] .......................... H01L 23/02; H01L 23/28; H01L 23/36; H01L 23/48

[52] U.S. Cl. .......................... 257/675; 257/717; 257/706; 257/796; 257/736; 257/76; 257/789; 257/707; 257/666

[58] Field of Search .................... 257/676, 675, 257/672, 707, 706, 788, 789, 796, 736, 717, 712

[56] References Cited

U.S. PATENT DOCUMENTS

| | | | |
|---|---|---|---|
| 4,582,556 | 4/1986 | Butt et al. | 156/325 |
| 4,697,203 | 9/1987 | Sakai et al. | 257/681 |
| 4,707,724 | 11/1987 | Suzuki et al. | 257/677 |
| 4,767,049 | 8/1988 | Butt et al. | 228/111 |
| 4,803,543 | 2/1989 | Inayoshi et al. | 257/783 |
| 4,838,347 | 6/1989 | Dentini et al. | 257/786 |
| 4,884,124 | 11/1989 | Mori et al. | 257/783 |
| 4,888,449 | 12/1989 | Crane et al. | 174/52.4 |
| 4,943,843 | 7/1990 | Okinaga et al. | 257/666 |
| 4,961,106 | 10/1990 | Butt et al. | 257/687 |
| 4,965,227 | 10/1990 | Chang et al. | 437/207 |
| 5,001,546 | 3/1991 | Butt | 257/666 |
| 5,025,114 | 6/1991 | Braden | 257/676 |
| 5,098,796 | 3/1992 | Lin et al. | 428/607 |
| 5,107,327 | 4/1992 | Nishimori et al. | 257/793 |
| 5,121,187 | 6/1992 | Yamazaki et al. | 257/753 |
| 5,122,858 | 6/1992 | Mahulikar et al. | 257/753 |
| 5,198,964 | 3/1993 | Ito et al. | 257/796 |
| 5,221,859 | 6/1993 | Kobayashi et al. | 257/677 |
| 5,299,214 | 3/1994 | Nakamura et al. | 252/706 |
| 5,343,073 | 8/1994 | Parthasarathi et al. | 252/741 |
| 5,345,106 | 9/1994 | Doering et al. | 257/706 |

FOREIGN PATENT DOCUMENTS

| | | | |
|---|---|---|---|
| 0399447 | 11/1990 | European Pat. Off. | |
| 0013748 | 1/1989 | Japan | 257/717 |
| 0248548 | 10/1989 | Japan | 257/717 |

OTHER PUBLICATIONS

Guenin et al, "Reliability and Performance of Non–Hermetic, Surface–Mount QUAD Flat Packages", presented at ECDC Conference Proceedings, May 1994.

Bowman et al, "Reliability and Performance of Stress–Absorbing Adhesives for Silicon–Die Bonding" appearing in Proceedings of the Joint ASME/JSME Advances in Electronic Packaging. EEP–vol. 2. Book No. G0660B (1992) at pp. 877–883.

*Primary Examiner*—Alexander Oscar Williams
*Attorney, Agent, or Firm*—Gregory S. Rosenblatt; Wiggin & Dana

[57] ABSTRACT

There is provided a leadframe assembly for encapsulation in a polymer resin which prevents post-assembly fracture or swelling of the resin. The leadframe is coated with an adhesion enhancing layer that increases the shear stress required for delamination to in excess of about 3.4 MPa. In combination with this adhesion enhancing layer is a compliant die attach adhesive bonding an integrated circuit device to a central die attach paddle. This compliant die attach adhesive has a compliancy factor, $E \cdot a$ of less than 1.5 MPa/°C. and a thickness of from about 0.01 mm to about 0.08 mm.

9 Claims, 2 Drawing Sheets

SEMICONDUCTOR PACKAGE WITH MOLDED PLASTIC BODY

BACKGROUND OF THE INVENTION

1. Field of the Invention

This patent application relates to molded plastic packages for encapsulating semiconductor devices. More particularly, leadframe treatments that improve adhesion of the leadframe to a plastic molding resin are combined with specific die attach materials. The resultant packages are resistant to post-assembly fracture, such as "pop corning".

2. Background

Electronic packages to encase one or more semiconductor devices frequently have a molded polymer resin body partially encapsulating a conductive metal leadframe. The inner lead portions of the leadframe define an aperture. Frequently, a die attach paddle is disposed in this aperture. A semiconductor device is bonded to the die attach paddle and electrically interconnected to the inner lead portions by small diameter, typically on the order of 0.025 millimeter (0.001 inch), bond wires. The inner lead portions of the leadframe, the die attach paddle, the wire bonds and the semiconductor device are then encapsulated in the polymer molding resin.

One problem with the molded plastic package is that subsequent to molding, internal delamination, the separation of package components from the molding resin, frequently occurs. In severe cases, a crack develops, creating an ingress site for contaminants. Also, if moisture enters along a delamination, the package base can swell making electrical interconnection to a printed circuit board difficult or impossible.

The package has two locations particularly prone to delamination, the interface of the leadframe and the molding resin and the die attach interface between the semiconductor device and the die attach paddle.

Delamination at the interface of the leadframe and the molding resin is primarily due to inadequate adhesion between the leadframe and the molding resin. Delamination at the die attach interface is primarily due to stresses generated by coefficient of thermal expansion mismatch between the semiconductor device and the leadframe.

U.S. Pat. No. 4,888,449, to Crane et al. discloses coating copper alloy components with various metallic materials to improve adhesion to a polymer adhesive. The adhesion of a copper alloy leadframe to a polymer molding resin is improved by coating the leadframe with a mixture of chromium and zinc as disclosed in U.S. Pat. No. 5,343,073 to Parthasarathi et al. U.S. Pat. No. 5,367,196 to Mahulikar et al. discloses coating a heat spreader with an adhesion enhancing material. The Crane et al., the Parthasarathi et al. and Mahulikar et al. patents are incorporated by reference herein in their entireties.

Polymer coatings also improve the adhesion of a leadframe to a molding resin as disclosed in U.S. Pat. No. 5,122,858 to Mahulikar et al. The adhesion of a die attach paddle to a molding resin is improved by forming depressions in the die attach paddle to mechanically lock the paddle to the molding resin as disclosed in U.S. Pat. No. 4,884,124 to Mori et al.

Improving the adhesion between the leadframe and the molding resin reduces delamination. However, molded plastic packages still fail due to vulnerability at the die attach interface. Additionally, treatments which effectively improve adhesion of the leadframe to the molding resin frequently adversely affect the strength of the bond between bond wires and the inner lead portions of the leadframe.

There exists, therefore, a need for a semiconductor package which resists delamination and cracking and is characterized by high strength wire bonds.

SUMMARY OF THE INVENTION

Accordingly, it is an object of the invention to provide a molded polymer resin semiconductor package which has reduced post-molding delamination and cracking. As a second objective of the invention, the package is characterized by high strength wire bonds.

Among the features of this invention are a treatment to improve adhesion between the leadframe and the molding resin combined with a low stress die attach system. Yet another feature of the invention is that the low stress die attach system is compliant and has a specific thickness. It is another feature of the invention that wire bond strength is increased either by a compliant copper layer on the surface of the leadframe or by selective removal of the treatment layer from a portion of the leadframe.

Among the advantages of the invention are that the leadframe treatment improves adhesion between the leadframe and a molding resin reducing delamination. Yet another advantage of the invention is that the low stress die attach system reduces cracking and delamination at the interface between a semiconductor device and a die attach paddle. Still another advantage of the invention is that higher strength wire bonds are obtained.

In accordance with the invention, there is provided a leadframe assembly. The leadframe assembly has a metallic leadframe with a plurality of leads. Each lead has an inner portion and an outer portion with the inner portions defining a central aperture. A metallic die attach paddle is disposed within the central aperture. An adhesion enhancing layer coats the inner portion of the leads and the die attach paddle. A compliant die attach is adjacent to one side of the metallic die attach paddle. This compliant die attach has a thickness of from about 0.007 mm to about 0.13 mm and a compliancy factor, E·a, of less than about 1.5 MPa/°C.

In accordance with a second embodiment of the invention, a layer of malleable copper is disposed between the metallic leadframe and the adhesion enhancing layer. In accordance with a third embodiment of the invention, the adhesion enhancing layer is selectively removed from a portion of the leadframe prior to wire bonding.

The above stated objects, features and advantages, as well as others, will become apparent from the specification and drawings which follow.

IN THE DRAWINGS

DETAILED DESCRIPTION

Figure 1:
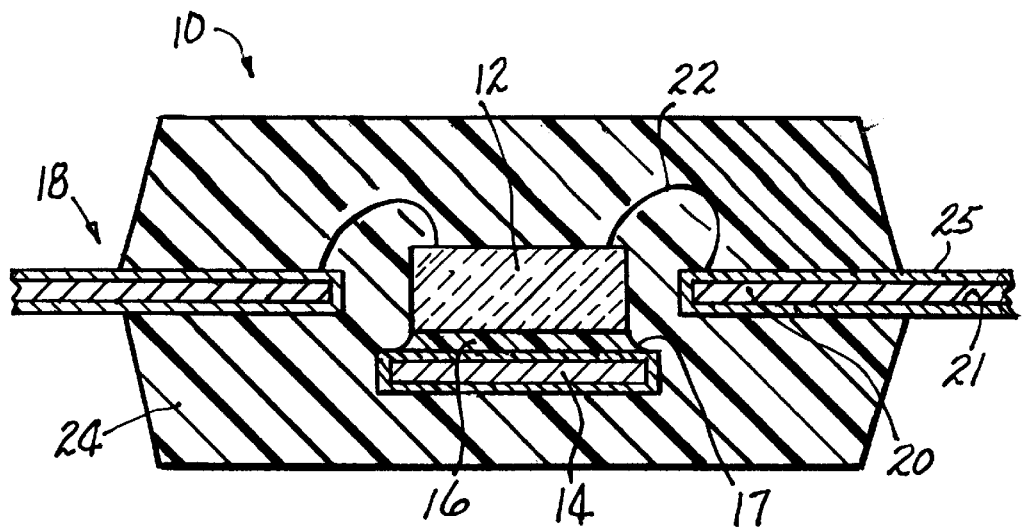
FIG. 1 illustrates in cross-sectional representation a leadframe assembly according to the present invention incorporated into a molded plastic semiconductor package.

FIG. 1 shows in cross-sectional representation a molded plastic semiconductor package 10 embodying the concepts of the invention. The molded plastic semiconductor package 10 encapsulates a semiconductor integrated circuit (IC) device 12. The IC device 12 is usually formed from silicon or gallium/arsenide. The IC device 12 is supported by a die attach paddle 14. A compliant die attach adhesive 16 bonds the IC device 12 to a first side 17 of the die attach paddle 14.

A leadframe 18 has a plurality of leads, each with an inner lead portion 20 electrically interconnected to the IC device 12 by a wire bond 22 or a thin strip of copper foil as used in tape automated bonding (TAB) and an outer lead portion 21.

A polymer resin 24, typically a thermosetting epoxy, encapsulates the integrated circuit device 12, the die attach paddle 14 and the inner lead portions 20 of the leadframe 18. To prevent fracture of the polymer resin 24, three conditions must be met:

1. The adhesion between the leadframe 18 and the polymer resin 24 is in excess of about 3.4 MPa (500 psi) in a shear adhesion test.

2. The compliant die attach adhesive 16 has a maximum E·a value of about 1.5 MPa/°C.

3. The thickness of the compliant die attach adhesive 16 is in the range of from about 0.01 mm to about 0.08 mm (0.0005–0.003 inch).

To achieve the first condition, the leadframe 18 is coated with an adhesion enhancing layer 25. The adhesion enhancing layer 25 is selected to increase the shear stress required to separate the leadframe from the molding resin to in excess of about 3.4 MPa. The shear strength is evaluated after simulating the temperature exposure a leadframe assembly undergoes during package assembly and use:

(1). The leadframe assembly is partially embedded in a molding resin.

(2). The encapsulated leadframe assembly is exposed to 96 hours in a pressure cooker at temperature of 121° C. at 100% relative humidity and one atmosphere of pressure.

(3). Solder reflow is then simulated by rapidly heating the assembly to a temperature of 220° C. for 2 minutes.

Following the simulated package assembly, the leadframe must adhere to the molding resin when subjected to a shear stress of at least 3.4 MPa and preferably to a shear stress in the range of from about 5.2 MPa to about 10.3 MPa (750–1500 psi).

Various coating layers are known to be effective to increase the adhesion of a leadframe to a polymer. Metallic materials are disclosed in U.S. Pat. No. 4,888,449 to Crane et al and a mixture of zinc and chromium is disclosed in U.S. Pat. No. 5,343,073. Nonmetallic adhesion enhancing layers, such as polymers or oxides are also effective.

The adhesion enhancing layer 25 is any thickness effective to enhance adhesion between the leadframe and the molding resin to above the critical shear delamination value of 3.4 MPa. Typically, the adhesion enhancing layer is from about 10 angstroms to about 1000 angstroms thick and preferably from about 20 angstroms to about 100 angstroms thick.

The adhesion enhancing layer 25 improves the adhesion between the leadframe and the molding resin. However, the molded plastic semiconductor package 10 is still subject to delamination and cracking. Under these conditions, the failure location is not the interface between the die attach paddle and the molding resin, rather failure originates at the die attach interface between the IC device 12 and the die attach paddle 16. Failure at the die attach interface is prevented by selecting a die attach adhesive 16 satisfying the second and third conditions.

For conventional novolac based epoxy molding compounds such as Sumitomo 6300H (Sumitomo Bakelite Company, Tokyo Japan), a suitable die attach adhesive 16 satisfies the compliancy equation:

$$E \cdot a \leq 1.5 \text{ MPa/°C.} \tag{1}$$

E=the Young's modulus of the die attach adhesive at a temperature below the glass transition temperature of the adhesive.

a=the thermal coefficient of expansion (per degree Centigrade) for the adhesive at a temperature below the glass transition temperature of the adhesive.

Preferably, E·a is from about 0.05 MPa/°C. to about 1.2 MPa/°C. Suitable materials for the compliant die attach adhesive include certain silver filled epoxies such as Ablestik 965-1L (Ablestik Laboratories, Gardenia, Calif.) which has a compliancy factor of 0.3 MPa and silver filled silicones such as Dow Toray silver silicone (Dow Corning Toray Silicone Co., Tokyo, Japan) which has a compliancy factor of 0.1 MPa.

When the molding resin is more compliant than the conventional materials, a higher E·a value for the die attach adhesive is tolerated. For example, a compliancy value, E·a, of less than about 3.0 MPa is acceptable in combination with a bisphenol based molding compound. One such bisphenol based molding compound is Sumitomo 7100.

If the compliant die attach adhesive satisfies the compliancy equation, then the thickness of the die attach adhesive is critical. If the adhesive thickness is less than about 0.01 mm, stresses generated at the die attach interface lead to molding resin fracture even with a compliant die attach adhesive. If the adhesive thickness is in excess of 0.08 mm, heat transfer between the IC device 12 and the die attach paddle 14 is inhibited. The IC device is subject to detrimental internal heating. Preferably, the die attach adhesive has a thickness of from about 0.025 mm to about 0.05 mm.

In addition to compliancy, the die attach adhesive 16 should also resist the formation of voids and maintain stable adhesion to both the IC device and the die attach paddle during temperature cycling.

Figure 2:
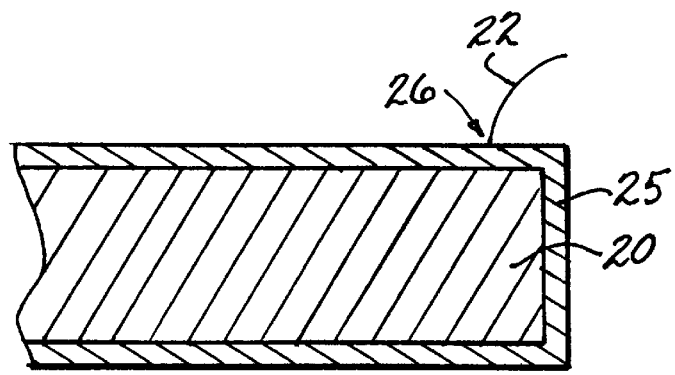
FIG. 2 illustrates in cross-sectional representation a wire bond to a leadframe treated according to the prior art.

Referring now to FIG. 2, when the inner lead portion 20 of a leadframe is coated with an adhesion enhancing layer 25, the strength of the bond 26 between a bond wire 22 and the inner lead portion 20 of the leadframe is often detrimentally affected.

For example, when a copper alloy C7025 (nominal composition by weight 2%–4.8% nickel, 0.2%–1.4% silicon, 0.05%–0.45% magnesium and the balance copper) is silver plated, the average pull strength necessary to separate a thermosonically bonded bond wire from the inner lead portion is about 9.5 grams. When the leadframe is coated with an adhesion enhancing layer 25 (without an intervening silver plate) comprising a mixture of chromium and zinc, the average pull strength drops to about 7.1 grams. 7.1 grams is substantially higher than the pull strength of under 3 grams required to separate a thermosonically bonded wire bond from untreated, unplated copper alloy C7025, however higher pull strengths, on the order of that achieved to a silver plated leadframe, are desired.

Figure 3:
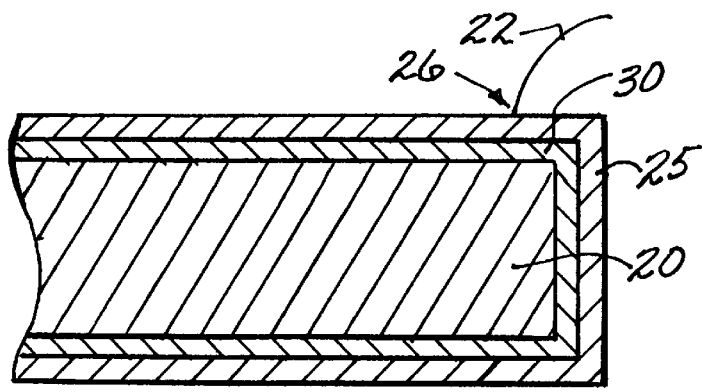
FIG. 3 illustrates in cross-sectional representation a wire bond to a leadframe treated in accordance with an embodiment of the invention.

One way to increase the pull strength is illustrated in FIG. 3. The leadframe 20 is coated with an adhesion enhancing layer 25 such as a mixture of chromium and zinc. Disposed between the inner lead portion 20 and the adhesion enhancing layer 25 is a malleable layer 30. The malleable layer 30 is an electrically conductive material with a yield strength substantially less than that of the leadframe. Preferably, the yield strength of the malleable layer is less than about 138 MPa (20 ksi) and preferably from about 34 MPa (5 ksi) to about 69 MPa (10 ksi). The malleable layer 30 is also selected to be essentially free of second phase particulate when compared to typical copper base leadframe alloys such as C194 (nominal composition by weight 2.1%–2.6% iron, 0.015%–0.15% phosphorous, 0.05%–020% zinc and the balance copper) and C7025.

The preferred malleable layer 30 is a thin layer of either pure copper or a dilute copper alloy such as C102 (oxygen free copper having a minimum copper content of 99.95%, by weight) and C110 (electrolytic tough pitch copper having a minimum copper content of 99.90%, by weight). The thickness of the malleable layer is from about 1 to about 20 microns and preferably from about 5 to about 10 microns.

The malleable layer 30 is deposited by any suitable method such as electrolytic or electroless plating, vapor deposition or cladding. When the malleable layer 30 is a clad, heating of the leadframe assembly during die attach, typically at a temperature in excess of about 200° C., anneals the malleable layer 30 to a fully soft condition prior to wire bonding.

While described in terms of copper base alloy leadframes, the malleable layer also improves the strength of wire bonds to other types of leadframes such as iron/nickel base alloy leadframes.

Figure 4:
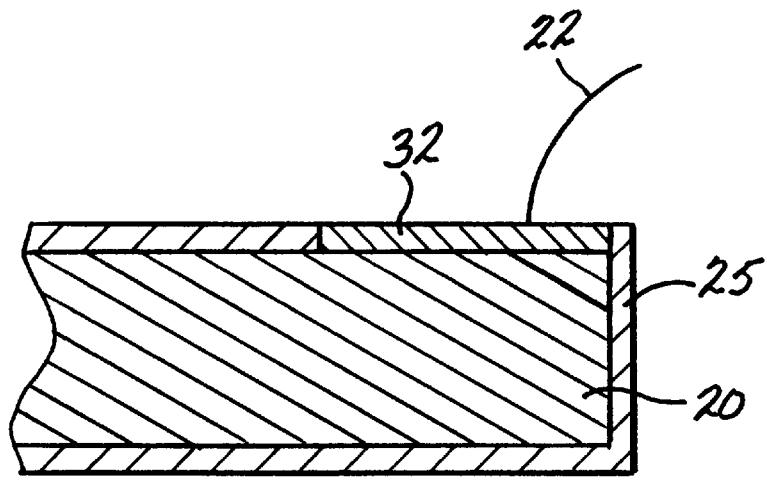
FIG. 4 illustrates in cross-sectional representation a wire bond to a leadframe treated in accordance with a second embodiment of the invention.

Another means for improving wire bond strength is illustrated in cross-sectional representation in FIG. 4. The inner lead portion 20 is selectively coated with a wire bondable layer 32 such as silver. The selective coating may be by a process such as electrolytic spot plating as known in the art. The entire leadframe is then coated with an adhesion enhancing layer 25 as described above. Prior to wire bonding, the adhesion enhancing layer 25 is selectively removed from the area coated with the wire bondable layer 32 using a gaseous etching or sputtering process.

To selectively remove the adhesion enhancing layer 25, a contact mask having an aperture of a desired configuration is positioned adjacent to the inner leads. The apertured contact mask exposes only those portions of the inner leads coated by the wire bondable layer 32. A gaseous line of sight etching or sputtering system removes the adhesion enhancing layer 25 from the exposed portions. The remainder of the adhesion enhancing layer is unaffected and available to provide adhesion enhancement and oxidation resistance.

Suitable gaseous phase material removal processes include plasma etching, ultra-violet ozone etching, ion milling and sputtering.

Selective removal of the adhesion enhancing layer is done either before or after bonding the IC device to the die attach paddle. Selective removal of the adhesion enhancing layer from a portion of the die attach paddle may be included. The adhesion enhancing layer improves adhesion of the compliant die attach adhesive to the die attach paddle and is desirable on that portion of the die attach paddle overlaid by the IC device. Removal from other portions of the die attach paddle facilitates wire bonding to electrically interconnect the IC device to the die attach paddle for an electrical ground.

While the present invention has been described in terms of a molded plastic package incorporating a leadframe, it is equally applicable to molded plastic packages which do not include a leadframe, but rather have conductive metal circuit traces bonded on a printed circuit board, such as a ball grid array package and a land grid array package.

Figure 5:
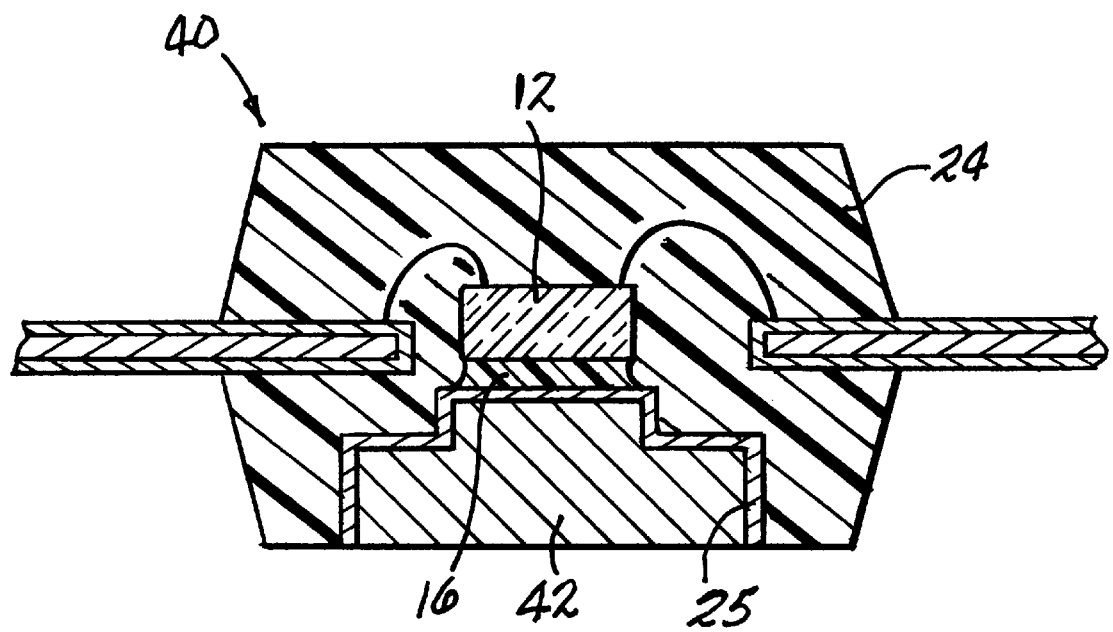
FIG. 5 illustrates in cross-sectional representation a heat spreader according to the present invention partially encapsulated into a molded plastic semiconductor package.

As illustrated in cross-sectional representation in FIG. 5, the concepts of the invention also apply to a molded plastic package 40 including a heat spreader 42 which is at least partially encapsulated in the molding resin 24. The heat spreader 42 which may be any thermally conductive material such as copper, aluminum or alloys thereof, is also coated with the adhesion enhancing layer 25.

An IC device 12 is bonded either directly to the heat spreader 25, to an intervening buffer or to a die attach paddle using the compliant die attach adhesive 16 as described above.

The requirements for the adhesion enhancing layer 25 and the compliant die attach adhesive 16 are similar to the requirements for those components as detailed above.

It is apparent that there has been provided in accordance with this invention, a unique combination of a leadframe treatment and the selection of a compliant die attach adhesive which fully satisfies the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A leadframe assembly, comprising:

a metallic leadframe having a plurality of leads, each said lead having an inner lead portion and an outer lead portion, said inner lead portions defining a central aperture;

a metallic heat spreader disposed within said central aperture;

an adhesion enhancing layer coating at least a portion of said inner lead portion and of said heat spreader;

a compliant die attach adhesive adjacent to one side of said metallic heat spreader, said compliant die attach adhesive having a thickness of from about 0.01 mm to about 0.08 mm and a compliancy factor, E·a, of less than about 1.5 MPa/°C.; and a molding resin encapsulating said inner lead portion and partially encapsulating said heat spreader.

2. The leadframe assembly of claim 1 wherein the thickness of said adhesion enhancing layer is from about 10 angstroms to about 1000 angstroms and said adhesion enhancing layer is effective to increase the adhesion between said lead frame and a polymer resin such that a shear stress in excess of 3.4 MPa is required for delamination.

3. The leadframe assembly of claim 2 wherein said compliant die attach adhesive has a thickness of from about 0.025 mm to about 0.05 mm.

4. The leadframe assembly of claim 3 wherein a portion of said heat spreader paddle is free of both said compliant die attach adhesive and of said adhesion enhancing layer.

5. A molded plastic electronic package, comprising:

a metallic leadframe having a plurality of leads, each said lead having an inner lead portion and an outer lead portion, said inner lead portions defining a central aperture;

a metallic die attach paddle disposed within said central aperture;

an adhesion enhancing layer coating at least a portion of said inner lead portion and of said die attach paddle;

a compliant die attach adhesive bonding an IC device to one side of said die attach paddle, said compliant die attach adhesive having a thickness of from about 0.01 mm to about 0.08 mm and a compliancy factor, E·a, of less than about 1.5 MPa/°C.; and a molding resin encapsulating said inner lead portion, said die attach paddle and said compliant die attach adhesive.

6. The electronic package of claim 5 wherein the thickness of said adhesion enhancing layer is from about 10 angstroms to about 1000 angstroms and said adhesion enhancing layer is effective to increase the adhesion between said lead frame and said molding resin such that a shear stress in excess of 3.4 MPa is required for delamination.

7. The electronic package of claim 6 wherein said compliant die attach adhesive has a thickness of from about 0.025 mm to about 0.05 mm.

8. The electronic package of claim 7 wherein a portion of said die attach paddle is free of both said compliant die attach adhesive and of said adhesion enhancing layer.

9. The electronic package of claim 7 wherein said molding resin is bisphenol based.

* * * * *